United States Patent [19]

Webb

[11] 4,129,878

[45] Dec. 12, 1978

[54] MULTI-ELEMENT AVALANCHE PHOTODIODE HAVING REDUCED ELECTRICAL NOISE

[75] Inventor: Paul P. Webb, Quebec, Canada

[73] Assignee: RCA Limited, Ste. Anne de Bellevue, Canada

[21] Appl. No.: 843,041

[22] Filed: Oct. 17, 1977

[30] Foreign Application Priority Data

Sep. 21, 1977 [CA] Canada ............................... 287176

[51] Int. Cl.² ..................... H01L 29/90; H01L 27/14
[52] U.S. Cl. ......................................... 357/13; 357/30; 357/90
[58] Field of Search ............................. 357/13, 30, 90

[56] References Cited

U.S. PATENT DOCUMENTS

| 3,514,846 | 6/1970 | Lynch | 29/572 |
|---|---|---|---|
| 3,534,231 | 10/1970 | Biard | 317/235 |
| 3,886,579 | 5/1975 | Ohuchi et al. | 357/13 |
| 3,959,646 | 5/1976 | de Cremoux | 250/211 J |
| 3,978,511 | 8/1976 | Digoy | 357/30 |
| 4,083,062 | 4/1978 | Ohuchi et al. | 357/13 |

OTHER PUBLICATIONS

Kanbe et al., *I.E.E.E. Transactions on Electron Devices,* vol. Ed. 23, No. 12, Dec. 1976, pp. 1337–1343.

*Primary Examiner*—Martin H. Edlow
*Attorney, Agent, or Firm*—H. Christoffersen; Birgit E. Morris

[57] ABSTRACT

Avalanche photodiodes include a substrate of a high resistivity material having at least a first surface. The substrate is of a particular conductivity type. In the substrate and at the first surface are a plurality of spaced apart regions of the same conductivity type as the substrate and defining the individual photodiode elements of the avalanche photodiode. Occupying the area at the first surface of the substrate not occupied by the spaced regions and extending into the substrate is a discontinuous layer of the same conductivity type as the spaced regions but of a conductivity concentration much lower than the conductivity concentration of the spaced regions. On the first surface of the substrate covering the discontinuous layer and slightly overlapping the spaced regions is a patterned passivation layer. The improvement of the present invention over the prior art is the addition of the discontinuous layer which reduces the electrical noise in the output signal of the avalanche photodiode.

8 Claims, 2 Drawing Figures

MULTI-ELEMENT AVALANCHE PHOTODIODE HAVING REDUCED ELECTRICAL NOISE

BACKGROUND OF THE INVENTION

The present invention relates to semiconductor photodiodes and more specifically to multi-element avalanche photodiodes having reduced electrical noise.

The growth of laser technology within the last decade has provided many new requirements for fast, sensitive, and rugged photodetectors. One photodetector which has found many applications in laser systems is the multi-element avalanche photodiode. The avalanche photodiode has found application in laser search systems, target designation systems and collision avoidance systems. An avalanche photodiode is a device wherein an applied reverse bias generates a depletion layer in the device which just "reaches through" a diffused p layer when the peak electric field at the avalanche junction is 5 to 10% less than that required to cause avalanche breakdown. Additional applied reverse bias extends the depletion layer through the substrate and slowly raises the peak electric field toward the avalanche breakdown point.

While the multi-element avalanche photodiode has found many applications in detector systems a problem which has been found by those in the semiconductor field is electrical noise which is generated in the avalanche photodiode. An avalanche photodiode having reduced electrical noise would be a device most desired in the semiconductor light detection field.

SUMMARY OF THE INVENTION

An avalanche photodiode includes a substrate of semiconductor material having a resistivity in the range of 500 to 20,000 ohm-cm and having first and second opposed surfaces. In said substrate and at the first surface are a plurality of spaced apart regions. The spaced regions are of the same conductivity type as the substrate. A discontinuous layer is in the substrate and substantially occupying that area of the first surface not occupied by the spaced regions. The discontinuous layer has a conductivity concentration lower than the lowest conductivity concentration of the spaced regions. It is this discontinuous layer which reduces electrical noise in the avalanche photodiode. A first layer is in the substrate and at the second surface and of a conductivity type opposite that of the substrate. A second layer is in said substrate, spaced from the second surface and contiguous to the first layer. The second layer is of the opposite conductivity type as the first layer and thereby forms an avalanche junction therebetween. On the first surface covering the discontinuous layer and slightly overlapping the spaced regions is a first passivation layer. On the periphery of the second surface and slightly overlapping the first layer is a second passivation region.

DETAILED DESCRIPTION OF THE INVENTION

Figure 1:
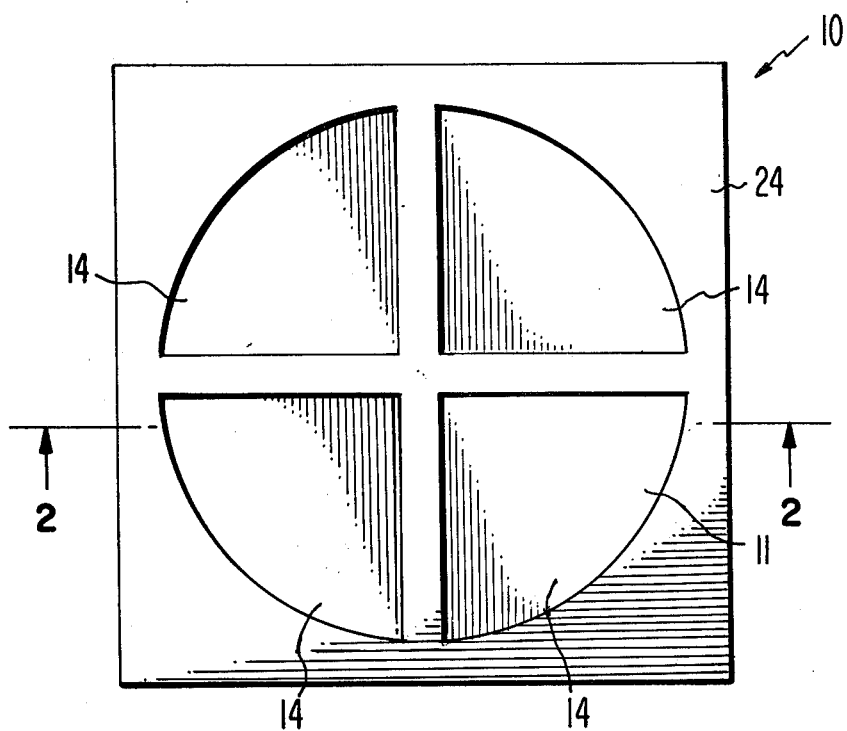
FIG. 1 is a top view of a first embodiment of the avalanche photodiode of the present invention.
Figure 2:
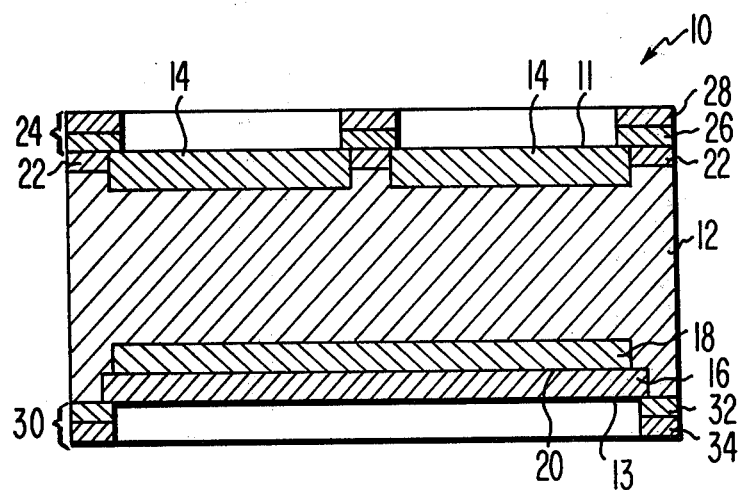
FIG. 2 is a cross-sectional view of the photodiode taken along line 2—2 of FIG. 1.

Referring to FIGS. 1 and 2, a multi-element avalanche photodiode of the present invention is generally designated as 10. The present invention is described specifically as a quadrant photodiode, i.e., having four elements. The avalanche photodiode 10 comprises a substrate 12 of high resistivity semiconductor material having opposed first and second surfaces 11 and 13. Typically, the substrate 12 is of P type silicon having a resistivity in the range of 500 to 20,000 ohm-cm with a preferable resistivity range of 3,000 to 5,000 ohm-cm.

In the substrate 12 and at a first surface 11 of the substrate 12 are spaced regions 14. The spaced regions 14 are of the same conductivity type as the substrate 12 but have a graded conductivity concentration that is highest at the first surface 11 and decreases toward the interface of the spaced regions 14 and the substrate 12. The spaced regions 14 typically have a conductivity concentration of $10^{20}/cm^3$ or greater at the first surface 11. Ohmic contact can readily be made to the spaced regions 14 at the first surface 11 because of the relatively high conductivity concentration at the first surface 11. The spaced regions 14 are shown as being quadrant shaped, with each individual spaced region 14 designating a particular photodiode element in the multi-element avalanche photodiode 10.

At the first surface of the substrate 12 and occupying the space between the spaced regions 14 and the space between the spaced regions 14 and the edge of the substrate 12, i.e., the area at the first surface 11 not occupied by the spaced regions 14, is a discontinuous layer 22. The discontinuous layer 22 is of the same conductivity type as the spaced regions 14, but of a lower conductivity concentration than the lowest conductivity concentration of the spaced regions 14. Typically, the conductivity concentration of the discontinuous layer 22 at the first surface 11 is in the range of $10^{11}/cm^2$ to $10^{12}/cm^2$. The discontinuous layer 22 provides the avalanche photodiode 10 with reduced electrical noise, as will subsequently be described.

In the substrate 12 and at the second surface 13 is a first layer 16 of the opposite conductivity type as the substrate 12. Contiguous to the first layer 16, spaced from the second surface 13 and in the substrate 12 is a second layer 18 of a conductivity type opposite that of the first layer 16, i.e., of the same conductivity type as the substrate 12, and forming an avalanche junction 20 therebetween. The first and second layers 16 and 18 typically do not extend to the edges of the substrate 12. The first layer 16 has a graded conductivity concentration with the highest concentration at the second surface 13, typically $10^{19}/cm^3$ or greater, and decreasing toward the avalanche junction 20. With the relatively high conductivity concentration at the second surface 13, ohmic contact can be readily made to the first layer 16 at the second surface 13. The second layer 18 also has a graded conductivity concentration which is highest at the avalanche junction 20 and decreases toward the interface of the second layer 18 and the substrate 12.

On the first surface 11 is a first passivation region 24 having essentially the same pattern shape as the discontinuous layer 22 but slightly overlapping the spaced regions 14. The first passivation region 24 includes one or more passivation layers. For the purpose of describing the present invention the first passivation region 24 includes a first passivation layer 26 of silicon dioxide contiguous to the first surface 11 with a second passivation layer 28 of silicon nitride contiguous to the first passivation layer 26. The passivation region 24 protects the lightly doped discontinuous layer 22 from contamination by impurities in the ambient which can readily alter its conductivity concentration. Furthermore, the first passivation region 24 is used as a mask in the fabrication of the spaced regions 14.

On the second surface 13 of the substrate 12 is a second passivation region 30 which extends along the periphery of the substrate 12 and slightly overlaps the first layer 16. The second passivation region 30, like the first passivation region 24, may comprise one or more passivation layers. Again, for the purpose of describing the present invention it is assumed that the second passivation region 30 includes a first passivation layer 32 of silicon dioxide contiguous to the second surface 13 and a second passivation layer 34 contiguous to the first passivation layer 32. Since the avalanche junction 20 is rather shallow, i.e., about 8 to 10 micrometers deep from the second surface 13, the second passivation region 30 protects the periphery of this junction from contamination from the ambient, for example, contamination by moisture.

For the purpose of describing the present invention it is assumed that the substrate 12, spaced regions 14, discontinuous layer 22 and second layer 18 are of P type conductivity, and the first layer 16 is of N type conductivity.

As previously described the conductivity concentration of both the spaced regions 14 and first layer 16 is highest at the first and second surfaces 11 and 13 respectively. Thus, electrical contact can be made to each of the photodiode elements of the avalanche photodiode 10 at the spaced regions 14 and an electrical contact common to all of the photodiode elements is made at the first layer 16.

In the operation of the avalanche photodiode 10 the avalanche diode junction 20 is reverse biased by connecting each of the spaced regions 14 to the negative polarity of an external voltage source (not shown) and by connecting the first layer 16 to the positive polarity of the same or another external voltage source. The biasing voltage should be sufficient so as to generate a depletion region from the avalanche junction 20 to the spaced regions 14 and into the discontinuous layer 22. What constitutes a sufficient voltage is a function of the thickness and resistivity of the substrate 12. As is well known to those skilled in the art, a depleted region is a region void of electrical carriers and is thus not conductive. Full depletion of the avalanche photodiode 10 as described is necessary so as to isolate each of the photodiode elements from each other. It is also well known to those in the art that an electric field is generated in the depletion region. In this particular case the electric field extends from the avalanche junction 20 to the spaced regions 14.

Electromagnetic radiation, either visible or invisible, which impinges the photodiode 10 and is absorbed in the substrate 12 generates electrical carriers, i.e., photogenerated carriers. With the avalanche photodiode 10 reversed biased, the photogenerated carriers will be collected by the electric field. Specifically, the holes will be swept to the spaced regions 14 while the electrons will be swept by the electric field to the avalanche junction 20 where they are multiplied and form the avalanche electrical signal of the photodiode 10.

Prior to applicants' invention, electrical noise was a problem encountered in multi-element avalanche photodiodes. It has been found that slightly doped discontinuous layer 22 substantially reduces electrical noise. It is not known with exact certainty how the discontinuous layer 22 reduces electrical noise, but it is believed that in prior art avalanche photodiodes the first passivation region, which typically comprises an oxide layer in direct contact with the substrate, induces an N-type surface inversion at the first surface of the P-type substrate. This inversion causes the formation of a quasi PN junction which is forward biased when the avalanche junction is reversed biased. This quasi PN junction causes carrier injection with the effect that unwanted carriers are injected into the avalanche junction and are sensed in the output signal of the photodiode as electrical noise.

The fabrication of the avalanche photodiode 10 of the present invention starts with a wafer of silicon of a relatively high resistivity, preferably in the range of 3,000–5,000 ohms/cm. This silicon wafer will become the substrate 12 of the avalanche photodiode 10. For the purpose of describing the present invention it is assumed that the substrate 12, the spaced regions 14, the discontinuous layer 22 and second layer 18 are of P type conductivity while the first layer 16 is of N type conductivity. On a surface of the silicon wafer which is to be the second surface 13, conventional masking and photoresist techniques are utilized to form a patterned mask which will define the second layer 18. Then by conventional ion implantation, a P type conductivity modifier, for example, boron, is ion implanted into the second surface 13. The mask formed on the second surface 13 is typically an oxide and should be of such a thickness as to stop the boron ion beam on those areas where the mask remains on the second surface 13. Typically, this oxide mask will be approximately 7500 angstroms in thickness. After ion implantation the oxide mask is stripped from the surface 13 and the boron is diffused into the wafer by using conventional diffusion techniques. Again, photoresist and masking techniques are used to form a patterned oxide mask on the second surface 13 which defines the first layer 16. Typically, this second oxide mask is slightly larger than the mask which defined the second layer 18. An N type conductivity modifier, for example, phosphorous doped oxide, is then deposited on the exposed areas of the second surface 13, and by conventional diffusion technqiues the phosphorous is diffused into the silicon wafer. The diffused phosphorous compensates some of the diffused boron and thus forms the first layer 16 while the remaining portion of the silicon wafer which has been boron diffused, forms the second layer 18. The second oxide mask is then stripped from the second surface 13 and the second passivation region 30, having a first layer 32 of silicon dioxide and a second layer 34 of silicon nitride, is formed by conventional masking and photoresist techniques following a further phosphorous diffusion by conventional techniques.

Before forming the spaced regions 14 and the discontinuous layer 22, the second surface 13 is masked with a waxed layer as a protective coating.

The surface of the wafer opposite second surface 13 is then chemically etched so as to reduce the thickness of the wafer to the desired thickness of the photodiode 10 thereby forming the first surface 11. A P type conductivity modifier is then ion implanted into the first surface 11. The dosage range typically used for this ion implantation step is typically in the range of 2 to 4 $\times 10^{11}/cm^3$ although a dosage in the range of about $1 \times 10^{11}$ to $1 \times 10^{12}/cm^3$ may be suitable depending on fabrication techniques and device application. The passivation layer 24 consisting of an oxide layer 26 and a silicon nitride layer 28 is applied to the surface 11 using conventional techniques. Thicknesses of the oxide layer 26 and silicon nitride layer 28 are not considered critical, but are typically each about 1000A in thickness. By conventional masking and photoresist techniques, a patterned mask is formed on the first surface 11 so as to define the spaced regions 14. Using boron nitride as a diffusion source, and by conventional diffusion techniques, boron is diffused into the substrate 12 in the exposed areas of surface 11 to form the spaced regions 14. That portion of the substrate 12 which has been ion implanted with the boron but has not received the boron diffusion becomes the discontinuous layer 22. Typically, fabrication of the photodiode 10 will be completed by conventional photoresist and metallizing techniques so as to form contact patterns (not shown in the FIGURES) on both the first and second surfaces 11 and 13.

While the spaced regions 14 are shown as being quadrant in shape, the present invention anticipates that the spaced regions can be of any shape known to those in the art. Furthermore, the discontinuous layer of the present invention can be utilized in any avalanche photodiode having a plurality of photodiode elements therein.

The slightly doped discontinuous layer of the present invention is used in avalance photodiodes for the purpose of reducing electrical noise in the photodiode output signal.

I claim:

1. A multi-element avalanche photodiode comprising:
    a substrate of a semiconductor material having a resistivity in the range of 500 to 20,000 ohm-cm, said substrate being of one conductivity type having first and second opposed surfaces;
    a plurality of spaced regions in said substrate and at said first surface, said spaced regions being of the same conductivity type as said substrate;
    a discontinuous layer in said substrate and substantially occupying that area at said first surface not occupied by said spaced regions, said discontinuous layer having a conductivity concentration lower than the lowest conductivity concentration of said spaced regions,
    a first layer in said substrate and at said second surface, said first layer of a conductivity type opposite that of said substrate;
    a second layer in said substrate spaced from said second surface and contiguous to said first layer, said second layer of the opposite conductivity type as said first layer thereby forming an avalanche junction therebetween;
    a first passivation region on said first surface covering said discontinuous layer and slightly overlapping said spaced regions; and
    a second passivation region extending along the periphery of said second surface and slightly overlapping said first layer.

2. The multi-element avalanche photodiode in accordance with claim 1 wherein said substrate has a resistivity in the range of 3,000 to 5,000 ohm-cm.

3. The multi-element photodiode in accordance with claim 1 wherein said spaced regions are quadrant in shape.

4. The multi-element avalanche photodiode in accordance with claim 1 wherein the conductivity concentration of said first layer is graded such that it is highest at said second surface and decreases toward said avalanche junction, and the conductivity concentration of said second layer is graded such that it is highest at said avalanche junction and decreases toward the interface of said second layer and said substrate.

5. The multi-element photodiode in accordance with claim 1 wherein said substrate, said spaced regions, said discontinuous layer and said second layer are of P type conductivity and said first layer is of N type conductivity.

6. The multi-element avalanche photodiode in accordance with claim 1 wherein said first passivation region includes a first layer of silicon dioxide contiguous to said first surface and a second layer of silicon nitride contiguous to said first layer.

7. The multi-element avalanche photodiode in accordance with claim 1 wherein said second passivation region includes a first layer of silicon dioxide contiguous to said second surface and a second layer of silicon nitride contiguous to said first layer.

8. The multi-element avalanche photodiode in accordance with claim 1 wherein said spaced regions have a conductivity concentration that is highest at said first surface and decreases toward the interface of said spaced regions and said substrate.

* * * * *